US008051980B2

(12) United States Patent
Tai et al.

(10) Patent No.: US 8,051,980 B2
(45) Date of Patent: Nov. 8, 2011

(54) PROTECTIVE SLEEVE FOR PORTABLE ELECTRONIC DEVICES

(75) Inventors: Lone-Wen Tai, Taipei Hsien (TW); Jun Dai, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 870 days.

(21) Appl. No.: 12/106,335

(22) Filed: Apr. 21, 2008

(65) Prior Publication Data

US 2009/0114556 A1    May 7, 2009

(30) Foreign Application Priority Data

Nov. 2, 2007    (CN) .......................... 2007 1 0202364

(51) Int. Cl.
 *B65D 85/00*    (2006.01)

(52) U.S. Cl. .................. 206/320; 455/575.8; 455/575.1; 455/575.3; 455/575.7; 455/575

(58) Field of Classification Search ........ 455/575–575.8
See application file for complete search history.

(56) References Cited

U.S. PATENT DOCUMENTS

| 7,555,325 B2 * | 6/2009 | Goros ..................... 455/575.8 |
| 2002/0148745 A1 * | 10/2002 | Chang ......................... 206/320 |
| 2003/0104850 A1 * | 6/2003 | Lai et al. ..................... 455/575 |

FOREIGN PATENT DOCUMENTS

| CN | 1383309 A | 12/2002 |
| CN | 2692968 Y | 4/2005 |
| JP | 2006106874 | 4/2006 |
| TW | 301420 | 3/1997 |
| TW | M308931 | 4/2007 |

* cited by examiner

*Primary Examiner* — Charles Appiah
*Assistant Examiner* — Michael Vu
(74) *Attorney, Agent, or Firm* — Altis Law Group, Inc.

(57) ABSTRACT

The present invention relates to a protective sleeve for a portable electronic device includes a sleeve frame, a cover, two connecting members, and a locking member. The sleeve frame includes four connecting sidewalls cooperatively defining a space for receiving the portable electronic device. The cover is covering the space of the sleeve frame. The connecting members are configured for pivotally/rotably attaching an end of the cover to the frame. The locking member is configured for latching and releasing, and thereby opening and closing the cover to the frame at another end of the cover. The protective sleeve for portable electronic device is convenient for use, and can fully protect the portable electronic device.

16 Claims, 8 Drawing Sheets

PROTECTIVE SLEEVE FOR PORTABLE ELECTRONIC DEVICES

CROSS-REFERENCE TO RELATED APPLICATIONS

This application is related to a co-pending U.S. patent applications, application Ser. No. 12/106,334, both entitled "PROTECTIVE SLEEVE FOR PORTABLE ELECTRONIC DEVICES", wherein the inventor is Lone-Wen Tai and Jun Dai. Such applications have the same assignee as the present application and have been concurrently filed herewith. The disclosures of the above identified applications are incorporated herein by reference.

BACKGROUND OF THE INVENTION

1. Field of the Invention

The present invention relates generally to protective sleeves and, more particularly to a protective sleeve for portable electronic devices.

2. Discussion of the Related Art

Portable electronic devices such as mobile phones, media players, or personal digital assistants (PDAs) are very popular and widely used. A variety of protective sleeves for protecting the portable electronic devices are also popularly used, these includes shock-proof packages, silica gel sleeves, colored plastic sleeves, leather sleeves, and so on. Although the protective sleeves can protect the portable electronic devices from shock or abrasion, they do have disadvantages.

For example, before using the portable electronic devices, it has to be taken out of the shock-proof package or the leather sleeve. Thus, it is an inconvenient to use the shock-proof package or the leather sleeve. Furthermore, once removed from the protective device, the portable electronic devices are no longer protected. Thus, the shock-proof package or the leather sleeve is useless when the phone is in use. Similarly, it is an inconvenient to place silica gel sleeve or colored plastic sleeve over the portable electronic device. In addition, the silica gel sleeve or the colored plastic sleeve must include an opening to expose a screen of the portable electronic devices, such that the silica gel sleeve or the colored plastic sleeve cannot fully protect the portable electronic devices.

What is needed, therefore, is a new protective sleeve that overcomes the above mentioned disadvantages.

SUMMARY

In one aspect, a protective sleeve for a portable electronic device includes a sleeve frame, a cover, two connecting members, and a locking member. The sleeve frame includes four connecting sidewalls cooperatively defining a space for receiving the portable electronic device. The sleeve frame further defines a mounting portion at the sidewall. The cover includes two retaining portions disposed on an edge. The connecting members are configured for pivotally/rotably attaching an end of the cover to the frame via the retaining portions and the mounting portion. The locking member is configured for latching and releasing, and thereby opening and closing the cover to the frame at another end of the cover opposite to the mounting portion.

When the locking member is latched, the cover covers the screen and keyboard of the mobile phone completely. When the locking member is released, the cover can be flipped opened via elastic force of the connecting member.

Other advantages and novel features will become more apparent from the following detailed description when taken in conjunction with the accompanying drawings.

BRIEF DESCRIPTION OF THE DRAWINGS

The components in the drawings are not necessarily drawn to scale, the emphasis instead being placed upon clearly illustrating the principles of the present protective sleeve for portable electronic devices. Moreover, in the drawings, like reference numerals designate corresponding parts throughout the several views, and all the views are schematic.

DETAILED DESCRIPTION OF THE EMBODIMENTS

Reference will now be made to the drawings to describe preferred embodiments of the present protective sleeve for portable electronic devices, in detail.

Figure 1:
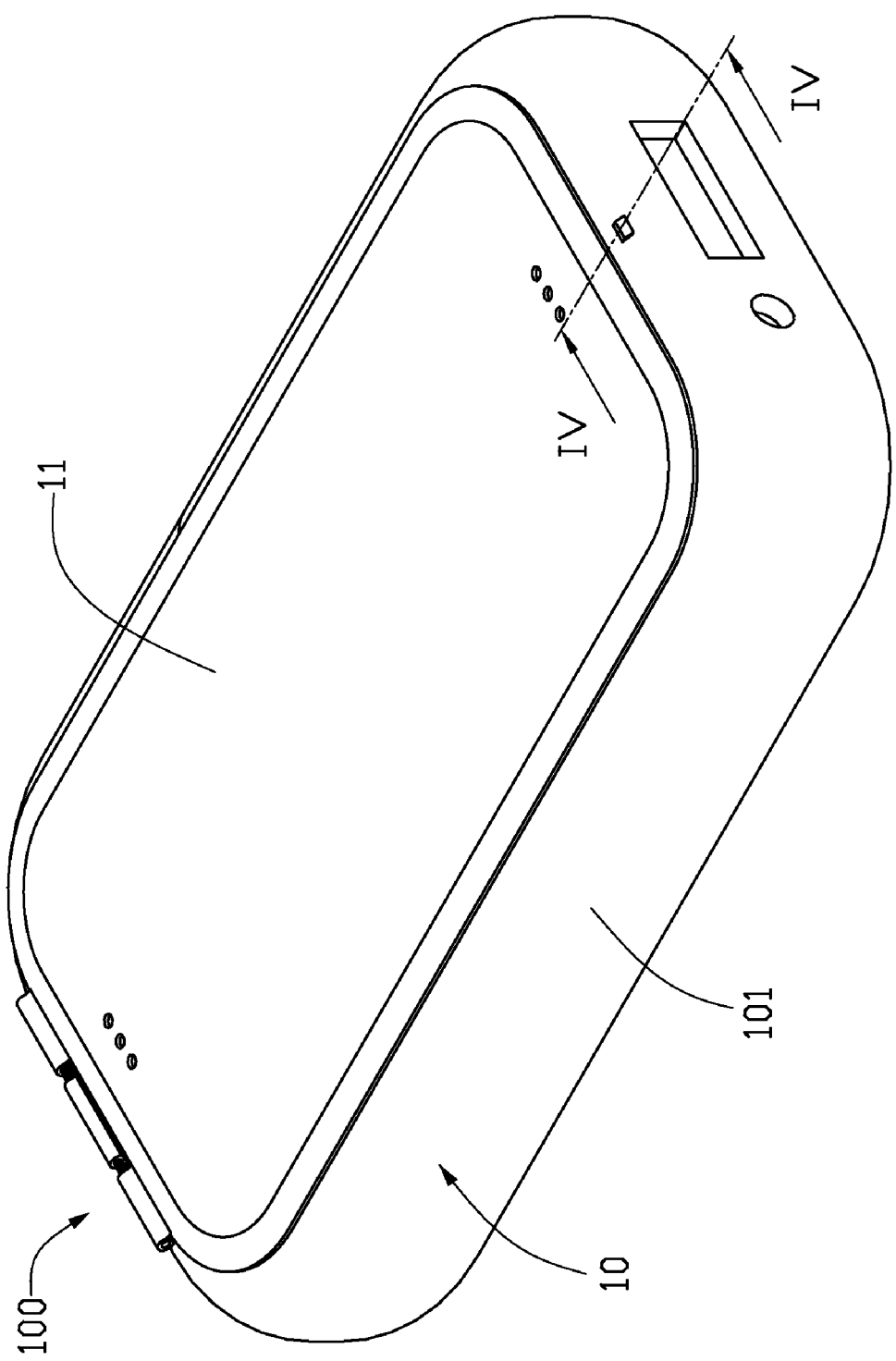
FIG. 1 is an assembled, isometric view of a protective sleeve in accordance with a first preferred embodiment of the present invention.
Figure 2:
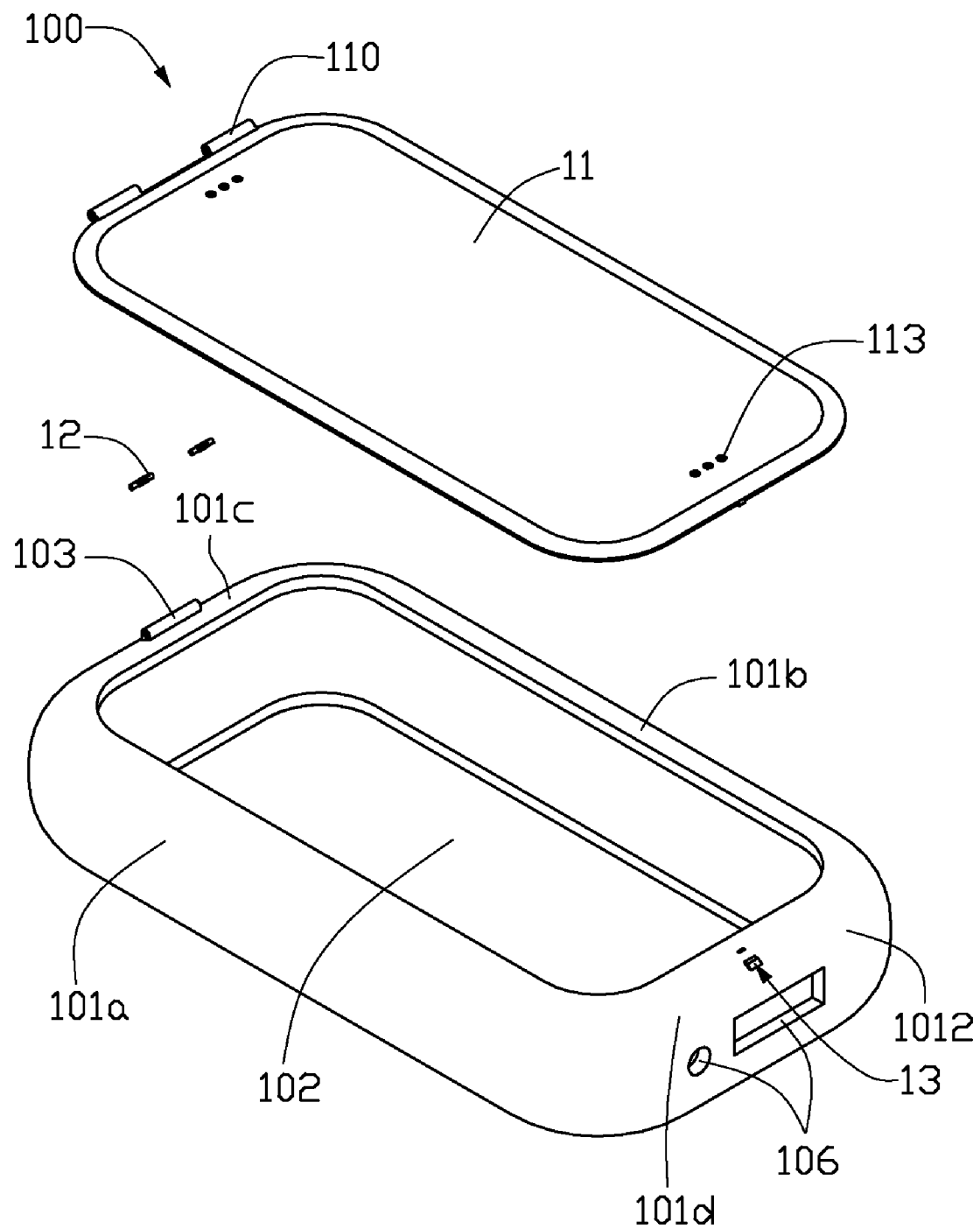
FIG. 2 is an exploded, isometric view of the protective sleeve of FIG. 1.

Referring to FIGS. 1 and 2, a protective sleeve 100 for a portable electronic device of a first preferred embodiment is shown. The protective sleeve 100 includes a sleeve frame 10, a cover 11, two connecting members 12, and a locking member 13. The sleeve frame 10 includes four connecting sidewalls 101 consisting of a first sidewall 101a, second sidewall 191b, top sidewall 101c, and a bottom sidewall 101d, cooperatively defining a space 102 for receiving the mobile phone. Latitudinal medial cross-sections of each of the sidewalls 101, are substantially C-shaped. The sleeve frame 10 further defines a mounting portion 103 at the top sidewall 101c. The mounting portion 103 is substantially a tubular structure. The bottom sidewall 101d defines a mounting groove 104 (see FIG. 4) on a side opposite to the mounting portion 103 and an engaging hole 105 (see FIG. 4) communicating with the mounting groove 104.

The cover 11 is a transparent plate that can be made of transparent plastic or glass. The cover 11 includes two retaining portions 110 disposed separately on an edge of the cover 11. Both of the retaining portions 110 are substantially tubular structures. The two retaining portions 110 define a space between them for receiving the mounting portion 103.

The connecting members 12 are configured for pivotally/rotatably attaching an end of the cover 11 to the frame 10 via the retaining portions 110 and the mounting portion 103. The locking member 13 is configured for latching and releasing, and thereby opening and closing the cover 11 to the frame 10 at another end of the cover 10 opposite to the mounting portion 103.

Figure 3:
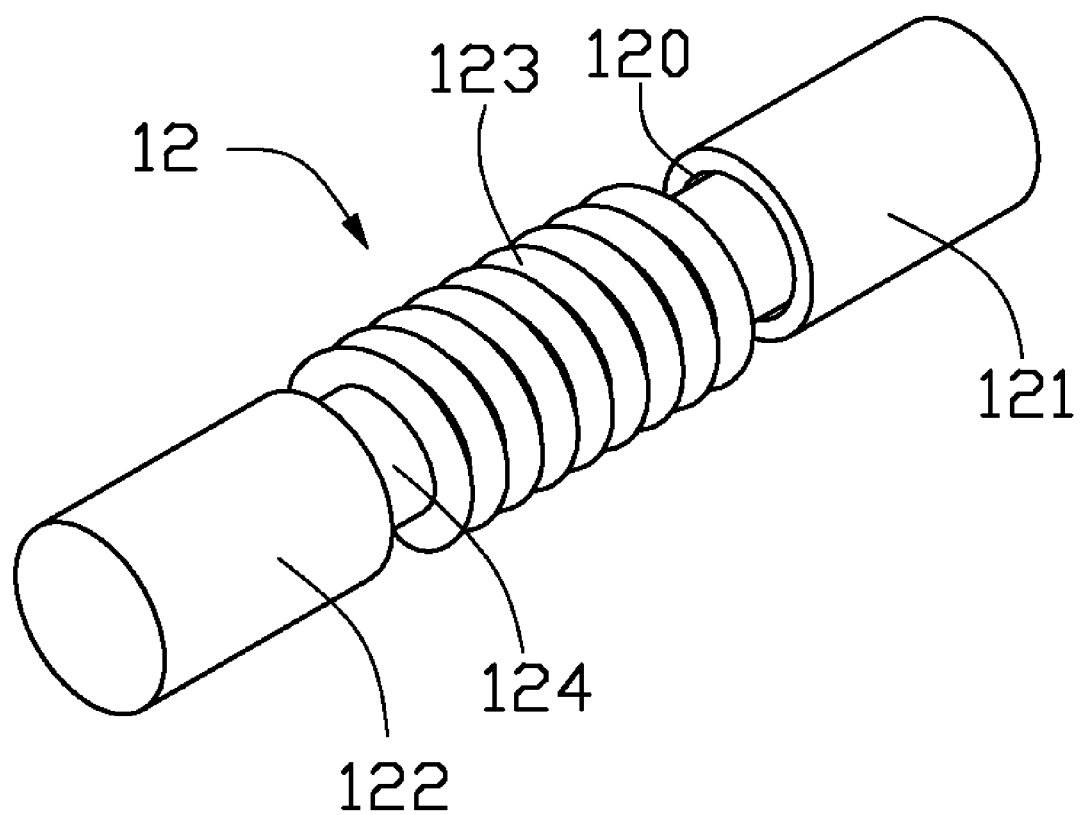
FIG. 3 is an enlarged, isometric view of a connecting member of the protective sleeve of FIG. 1.

Referring to FIG. 3, each of the connecting members 12 includes a fixing portion 121, a torsion portion 122, a torsion spring 123 and a rotary shaft 124. Both the fixing portion 121 and the torsion portion 122 are substantially cylindrical. An end of the fixing portion 121 and an end of the torsion portion 122 both define a shaft hole 120 correspondingly. Ends of the rotary shaft 124 are rotatably retained in the shaft holes 120 of the fixing portion 121 and the torsion portion 122 correspondingly. The torsion spring 123 is coiled around a middle portion of the rotary shaft 124, and two ends of the torsion spring 123 are fixed to the end of the fixing portion 121 and the end of the torsion portion 122 respectively. In assembly, the two connecting members 12 are mirror images of each other. The fixing portion 121 of each connecting member 12 is assembled into the mounting portion 103, and the torsion portion 122 of each connecting member 12 is assembled into the retaining portion 110. Thus, the sleeve frame 10 and the cover 11 are rotatably attached together. When the cover 11 is latched to the sleeve frame 10 via the locking member 13, the torsion spring 123 is at a resiliently deformed state. When the locking member 13 is released, the cover 11 would be flipped opened via resilient force of the torsion spring 123.

Figure 4:
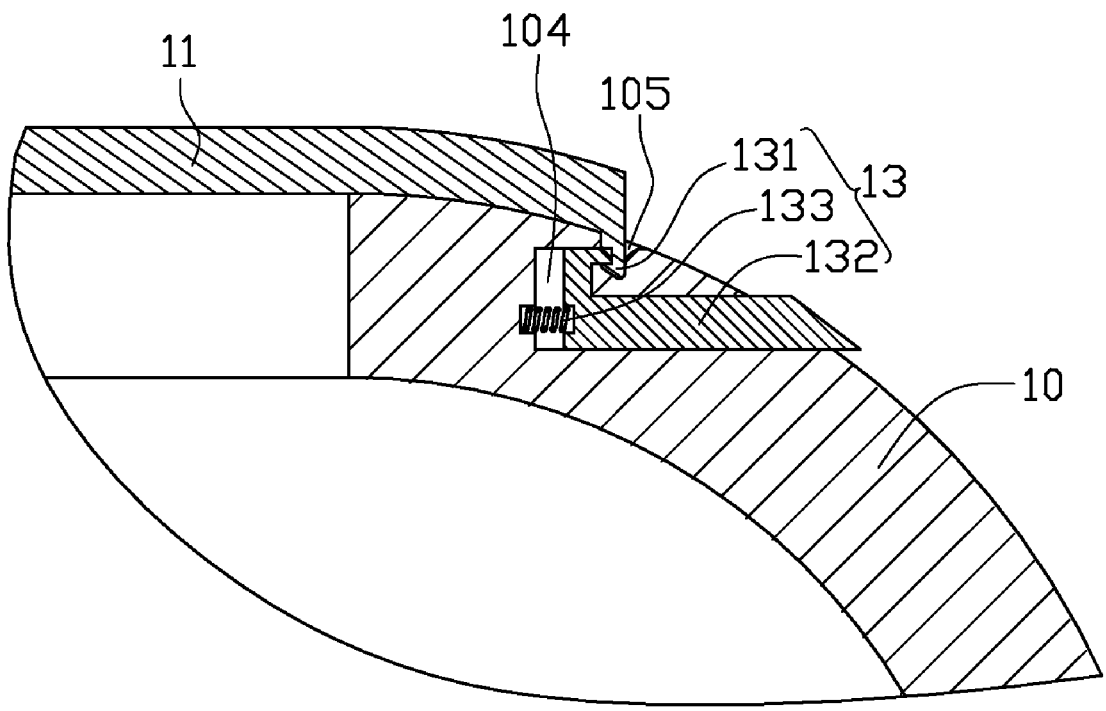
FIG. 4 is a partial, side cross-sectional view of the protective sleeve of FIG. 1, taken along line IV-IV thereof.

Referring to FIG. 4, the locking member 13 includes a first latching hook 131, a second latching hook 132 and a compression spring 133. The first latching hook 131 extends downward from a bottom surface of an end of the cover 11 corresponding to the mounting groove 104. The second latching hook 132 is mounted into the mounting groove 104 of the sleeve frame 10. The first latching hook 131 is configured to be insertable into the engaging hole 105 and engagable with the second latching hook 132. The second latching hook 132 is substantially L-shaped and an end of the second latching hook 132 is exposed to an outer surface of the sleeve frame 10. An end of the compression spring 133 is fixed on a side surface of the second latching hook 132, another end of the compression spring 133 is fixed on a side surface of the mounting groove 104. When the exposed end of the second latching hook 132 is pressed towards the mounting groove 104, the second latching hook 132 will push against and compress the compression spring 133. Thus, the second latching hook 132 can be detached from the first latching hook 131, and the locking member 13 can be released.

Referring to FIGS. 2 through 4 again, the sleeve frame 10 further includes two through holes 106 defined in the bottom sidewall 101d of the sleeve frame 10 corresponding to an earphone jack and a charger socket, respectively, of the mobile phone. As such, the earphone or the charger can be used when the mobile phone is in the space of the sleeve frame 10. The cover 11 further includes a reflection reducing coating (not shown) deposited on an inner surface of a portion of the cover 11 corresponding to a screen of the mobile phone. As such, the transparency of the cover 11 is increased due to the reflection reducing coating. The cover 11 also includes a plurality of through holes 113 defined in portions of the cover 11 corresponding to a speaker and a microphone, of the mobile phone. As such, the speaker and the microphone can be used when the mobile phone is inside the sleeve frame 10.

In this embodiment, the sleeve frame 10 is integrally formed by embed-molding technology. The four sidewalls 101 of the sleeve frame 10 are made of plastic materials reinforced by rigid materials, except that at least two opposite corners 1012 of the four sidewalls 101 are only made of plastic materials. Thus, the sleeve frame 10 can resiliently deform at the corners 1012. It is convenient to place the sleeve frame 10 over the mobile phone, and the sleeve frame 10 can accommodate mobile phones having different sizes. In addition, preferably, corners of the sleeve frame 10 and the cover 11 are rounded. Thus, the protective sleeve 100 for portable electronic device has a good appearance.

Figure 5:
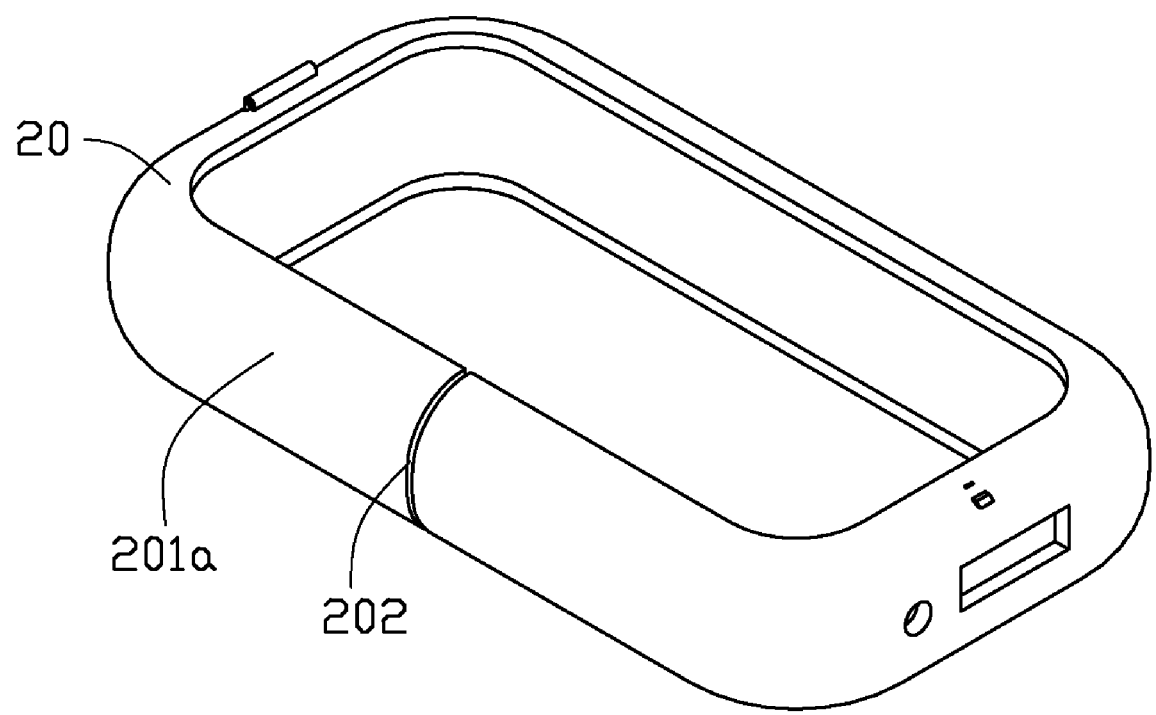
FIG. 5 is an isometric view of a sleeve frame of a protective sleeve in accordance with a second preferred embodiment of the present invention.

Referring to FIG. 5, a sleeve frame 20 of a protective sleeve in accordance with a second preferred embodiment of the present invention is shown. The sleeve frame 20 is similar as principle to the sleeve frame 10 of the first embodiment. However, the sleeve frame 20 further includes a slit 202 defined in a first sidewall 201a of the sleeve frame 20. The slit 202 runs through the first sidewall 201a of the sleeve frame 20, such that the first sidewall 201a of the sleeve frame 20 is divided into two parts. The sleeve frame 20 is made of rigid materials with a certain elasticity. In use, the sleeve frame 20 is placed over the mobile phone by pulling the slit 202 wider, and the slit 202 would recover, thereby the sleeve frame 20 receiving the mobile phone tightly.

Figure 6:
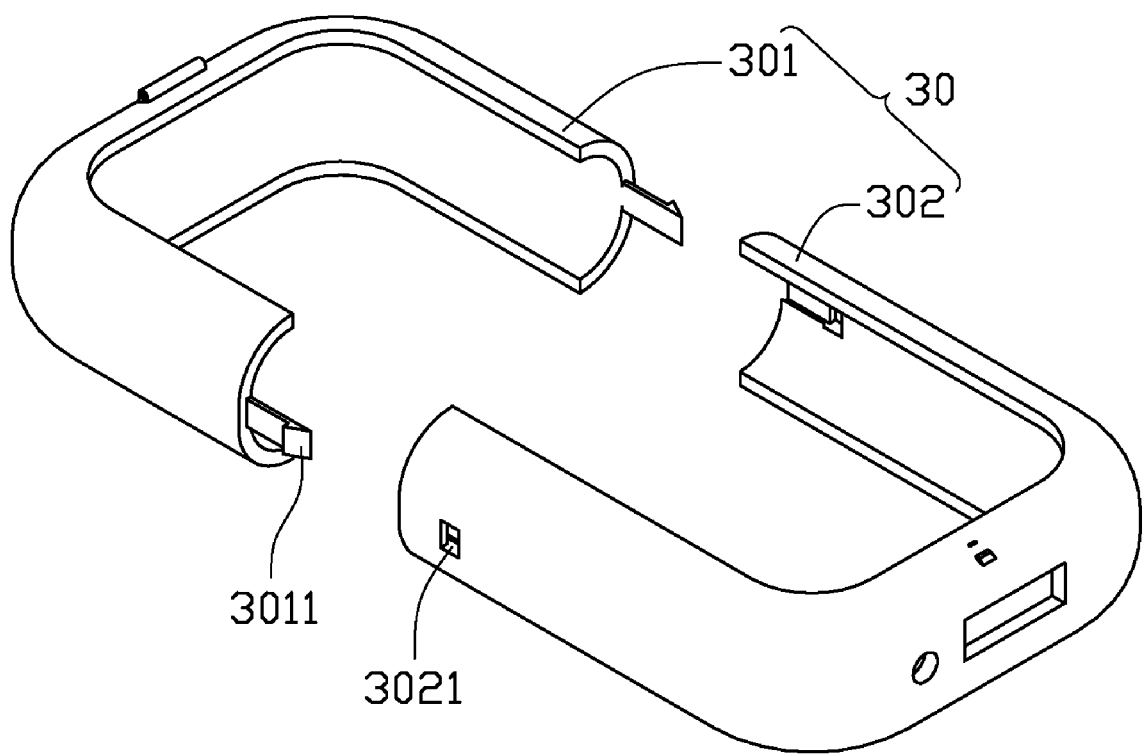
FIG. 6 is an isometric view of a sleeve frame of a protective sleeve in accordance with a third preferred embodiment of the present invention.

Referring to FIG. 6, a sleeve frame 30 of a protective sleeve in accordance with a third preferred embodiment of the present invention is shown. The sleeve frame 30 is similar as principle to the sleeve frame 10 of the first embodiment. However, the sleeve frame 30 includes a first frame 301 and a second frame 302. A pair of latching pins 3011 are formed on two ends of the first frame 301 and the second frame 302 defines a pair of latching holes 3021 adjacent its two ends. The pair of the latching pins 3011 of the first frame 301 are engaged into the pair of latching holes 3021 of the second frame 302. Thus, the first frame 301 and the second frame 302 are connected with each other to form the sleeve frame 30.

Figure 7:
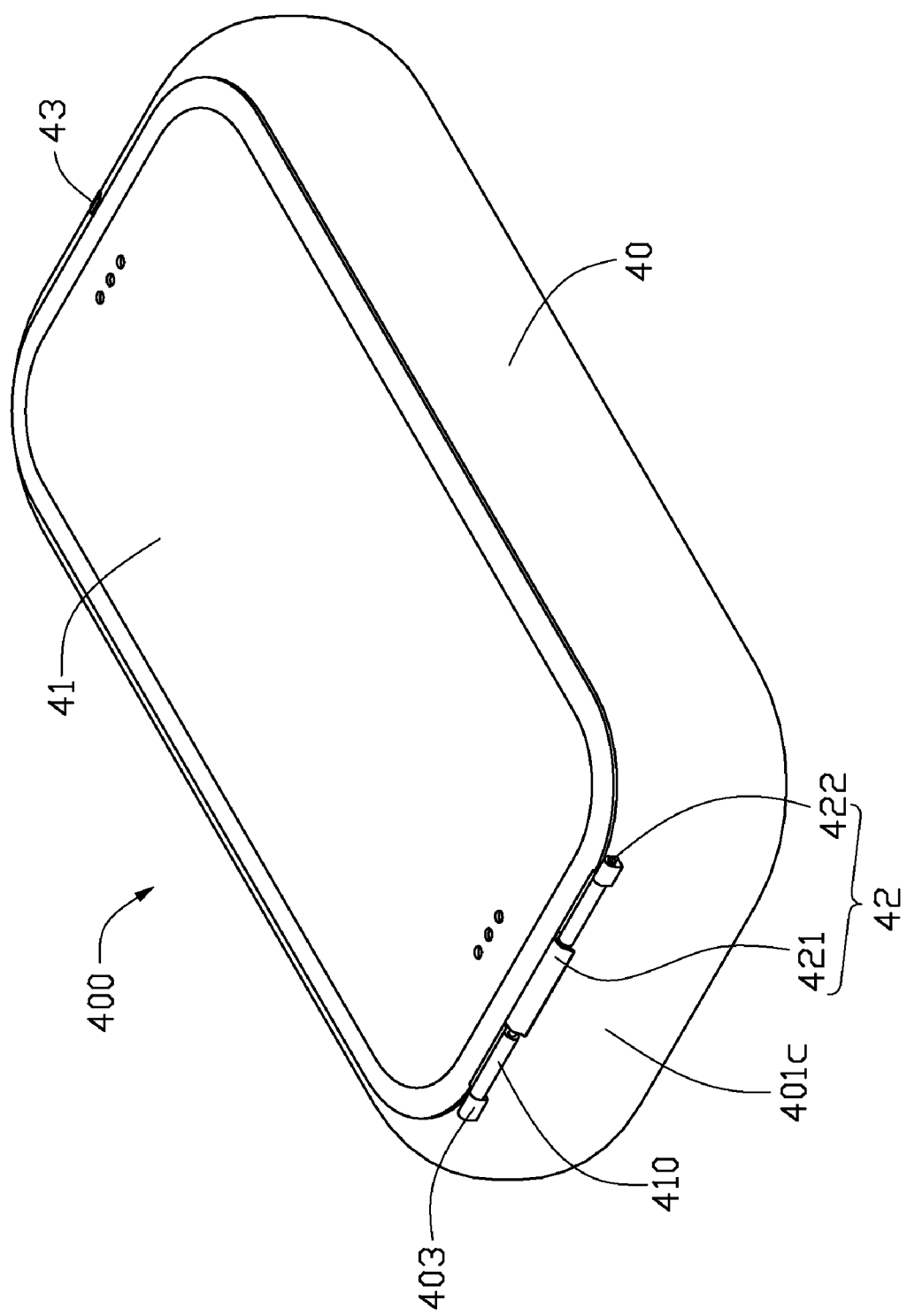
FIG. 7 is an assembled, isometric view of a protective sleeve in accordance with a fourth preferred embodiment of the present invention.

Referring to FIG. 7, a protective sleeve 400 in accordance with a fourth preferred embodiment of the present invention is shown. The protective sleeve 400 is similar in principle to the protective sleeve 100 of the first embodiment. However, the protective sleeve 400 includes a connecting member 42 for pivotally/rotatably attaching an end of a cover 41 to a frame 40 via two retaining portions 410 and two mounting portions 403. The connecting member 42 includes an elastic piece 421 and a rotary shaft 422. An end of the elastic piece 421 is fixed on a top sidewall 401c of the sleeve frame 40, and another end of the elastic piece 421 is fixed on an edge of the cover 41 correspondingly. The two mounting portions 403 are positioned adjacent to two ends of the top sidewall 401c respectively. The two retaining portions 410 are formed on the edge of the cover 41. The rotary shaft 422 runs through the mounting portions 403 and the retaining portions 410 for rotatably connected the cover 41 to the sleeve frame 40. When the cover 41 is latched to the sleeve frame 40 via the locking member 43, the elastic piece 421 is at a resiliently deformed state. When the locking member 43 is released, the cover 41 would be flipped opened via resilient force of the elastic piece 421.

Figure 8:
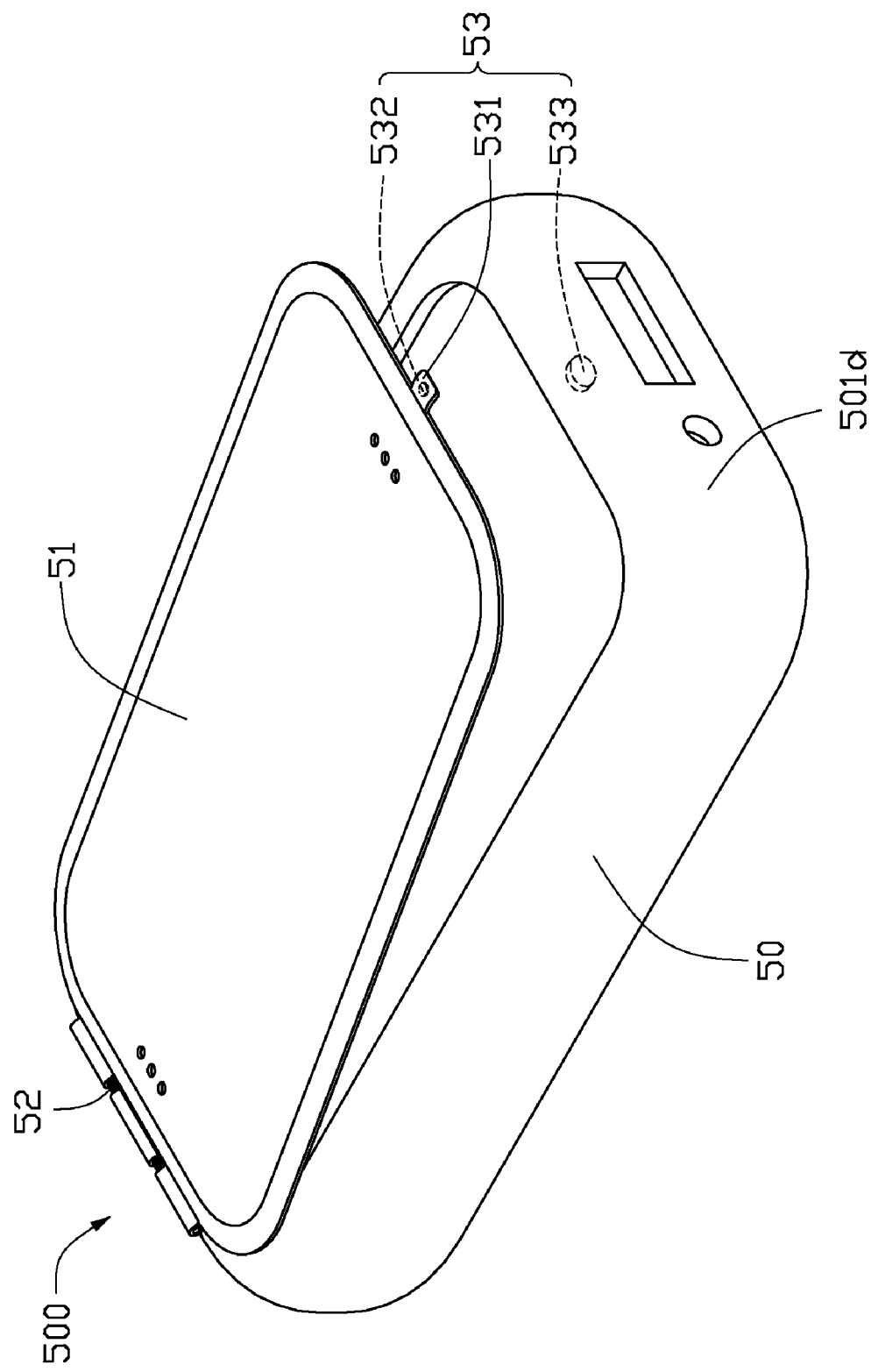
FIG. 8 is an assembled, isometric view of a protective sleeve in accordance with a fifth preferred embodiment of the present invention.

Referring to FIG. 8, a protective sleeve 500 in accordance with a fifth preferred embodiment of the present invention is shown. The protective sleeve 500 is similar in principle to the protective sleeve 100 of the first embodiment. However, the protective sleeve 500 includes a locking member 53 for latching and releasing, and thereby opening and closing the cover 51 to the frame 50. The locking member 53 includes a tab 531, a first magnetic member 532 and a second magnetic member 533. The tab 531 is disposed on an edge of the cover 51. The first magnetic member 532 is embedded in the tab 531. The second magnetic member 533 is embedded in a bottom sidewall 501d of the sleeve frame 50 corresponding to the first magnetic member 532. The locking member 53 can be latched by a magnetic force produced between the first and second magnetic members 532, 533.

The protective sleeve frame and the cover covers the screen and keyboard of the mobile phone completely. Thus, the protective sleeve for portable electronic device can fully protect the mobile phone. When an external force is applied to release the locking member, the cover can be flipped opened via a recovery force of the connecting member and reveal the screen and keyboard of the mobile phone. So, it is convenient to use the protective sleeve for the portable electronic device.

It should be understood that, the cover can also be designed to include two separate covers, for protecting the screen and keyboard of the mobile phone respectively. The cover can further have an interlayer for enclosing photographs, pictures, and so on. The sleeve frame can further have a ring formed at a corner for suspending a decoration, a key, and so on. In addition, the sleeve frame can further include a bottom plate to protect the back of the mobile phone. The bottom plate can define a latch on an outer surface and the latch can be used as a carrying means for the protective sleeve of the portable electronic device.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A protective sleeve for portable electronic devices, the protective sleeve comprising:
    a sleeve frame including a plurality of connecting sidewalls defining a space for receiving the portable electronic device;
    a cover for covering the space of the sleeve frame;
    at least one connecting member for pivotally attaching one end of the cover to the frame, wherein each of the at least one connecting member comprises a fixing portion, a torsion portion opposite to the fixing portion, a rotary shaft rotatable disposed between the fixing portion and the torsion portion, and a torsion spring sleeved on the rotary shaft and connecting the fixing portion and the torsion portion; and
    a locking member for latching and releasing, and thereby opening and closing the cover to the frame, at another end of the cover, wherein the torsion spring is at a resiliently deformed state when the cover is latched to the sleeve frame via the locking member, such that when the locking member is released, the cover would be flipped opened via resilient force of the torsion spring.

2. The protective sleeve for portable electronic devices as claimed in claim 1, wherein an end of the fixing portion and an end of the torsion portion both define a shaft hole correspondingly; the torsion spring is coiled around a middle portion of the rotary shaft; ends of the rotary shaft are rotatably retained in the shaft holes of the fixing portion and the torsion portion respectively; and ends of the torsion spring are fixed on the end of the fixing portion and the end of the torsion portion respectively.

3. The protective sleeve for portable electronic devices as claimed in claim 2, wherein the sleeve frame comprises a mounting portion disposed on the sidewall; the cover comprises two retaining portions disposed separately on an edge of the cover; the fixing portion of each of the connecting members is assembled into the mounting portion of the sleeve frame; and the torsion portion of each of the connecting members is assembled into the retaining portion of the cover.

4. The protective sleeve for portable electronic devices as claimed in claim 1, wherein the locking member comprises a first latching hook, a second latching hook engaged with the first latching hook, and a compression spring fixed on a side surface of the second latching hook.

5. The protective sleeve for portable electronic devices as claimed in claim 4, wherein the sleeve frame further comprises a mounting groove defined in the sidewall; the first latching hook extends downward from a bottom surface of an end of the cover; the second latching hook is mounted into the mounting groove of the sleeve frame corresponding to the first latching hook; an end of the compression spring is fixed on a side surface of the mounting groove.

6. The protective sleeve for portable electronic devices as claimed in claim 1, wherein the sidewalls of the sleeve frame are made of plastic materials reinforced by rigid materials, except that at least two opposite corners of the sidewalls are made of plastic materials.

7. The protective sleeve for portable electronic devices as claimed in claim 1, wherein a latitudinal medial cross-sections of each of the sidewalls are substantially C-shaped.

8. The protective sleeve for portable electronic devices as claimed in claim 1, wherein the cover is a transparent plate.

9. The protective sleeve for portable electronic devices as claimed in claim 1, wherein the cover further comprises a reflection reducing coating deposited on an inner surface of a portion of the cover corresponding to a screen of the portable electronic device received in the space of the sleeve frame.

10. The protective sleeve for portable electronic devices as claimed in claim 1, wherein the sleeve frame further comprises a plurality of through holes defined in portions of the sleeve frame corresponding to an earphone jack and a charger socket of the portable electronic device received in the space of the sleeve frame.

11. The protective sleeve for portable electronic devices as claimed in claim 1, wherein the cover further comprises a plurality of through holes defined in portions of the cover corresponding to a speaker and a microphone of the portable electronic device received in the space of the sleeve frame.

12. The protective sleeve for portable electronic devices as claimed in claim 1, wherein the sleeve frame defines a slit in the sidewall, and the slit runs through the sidewall of the sleeve frame.

13. The protective sleeve for portable electronic devices as claimed in claim 1, wherein the sleeve frame comprises a first frame and a second frame, the first frame defines a pair of latching pins on two ends thereof, and the second frame defines a pair of latching holes adjacent to two ends thereof; and the pair of the latching pins of the first frame are engaged into the pair of latching holes of the second frame respectively.

14. A protective sleeve for portable electronic devices, the protective sleeve comprising:
    a sleeve frame including a plurality of connecting sidewalls defining a space for receiving the portable electronic device;
    a cover for covering the space of the sleeve frame;
    at least one connecting member for pivotally attaching one end of the cover to the frame, wherein the connecting member comprises an elastic piece, an end of the elastic piece is fixed on the sidewall of the sleeve frame, and another end of the elastic piece is fixed on an edge of the cover correspondingly; and
    a locking member for latching and releasing, and thereby opening and closing the cover to the frame, at another end of the cover, wherein the elastic piece is at a resiliently deformed state when the cover is latched to the sleeve frame via the locking member, such that when the locking member is released, the cover would be flipped opened via resilient force of the elastic piece.

15. The protective sleeve for portable electronic devices as claimed in claim 14, wherein the connecting member further comprises a rotary shaft, the sidewall of the sleeve frame defines two mounting portions adjacent to two ends of the sidewall respectively, an edge of the cover defines two retaining portions corresponding to the mounting portion of the sleeve frame, and the rotary shaft runs through the mounting portion of the sleeve frame and the retaining portion of the cover for rotatably connected the cover to the sleeve frame.

16. The protective sleeve for portable electronic devices as claimed in claim 14, wherein the locking member comprises a tab, a first magnetic member and a second magnetic member; the tab is disposed on an edge of the cover; the first magnetic member is embedded in the tab; and the second magnetic member is embedded in the sidewall of the sleeve frame corresponding to the first magnetic member.

* * * * *